United States Patent [19]

Hatano

[11] Patent Number: 4,571,609

[45] Date of Patent: Feb. 18, 1986

[54] STACKED MOS DEVICE WITH MEANS TO PREVENT SUBSTRATE FLOATING

[75] Inventor: Hiroshi Hatano, Yokohama, Japan

[73] Assignee: Tokyo Shibaura Denki Kabushiki Kaisha, Kawasaki, Japan

[21] Appl. No.: 596,561

[22] Filed: Apr. 3, 1984

Related U.S. Application Data

[63] Continuation-in-part of Ser. No. 271,116, Jun. 8, 1981.

[30] Foreign Application Priority Data

Jun. 16, 1980 [JP] Japan .................................. 55-80159

[51] Int. Cl.[4] ........................................... H01L 27/02
[52] U.S. Cl. ..................................... 357/41; 357/23.1; 357/23.7; 357/23.12; 357/4; 357/55; 357/59
[58] Field of Search ....................... 357/23.7, 23.1, 42, 357/4, 59, 23.12, 88, 41, 55

[56] References Cited

U.S. PATENT DOCUMENTS

| 3,600,651 | 8/1971 | Duncan | 357/23 TF |
|---|---|---|---|
| 4,163,245 | 7/1979 | Kinoshita | 357/23 C |
| 4,241,359 | 12/1980 | Izumi et al. | 357/23 TF |
| 4,251,828 | 2/1981 | Sakurai | 357/23 TF |
| 4,272,880 | 6/1981 | Pashley | 357/42 |
| 4,326,213 | 4/1982 | Shirai et al. | 357/59 |
| 4,472,729 | 9/1984 | Shibata et al. | 357/59 |
| 4,476,475 | 10/1984 | Naem et al. | 357/59 |
| 4,487,635 | 12/1984 | Kugimiya et al. | 357/41 |

FOREIGN PATENT DOCUMENTS

| 0930477 | 7/1973 | Canada | 357/42 |
|---|---|---|---|
| 55-43872 | 3/1980 | Japan | 357/23 TF |
| 55-18052 | 5/1980 | Japan | 357/23.7 |
| 55-74172 | 6/1980 | Japan | 357/42 |
| 55-105361 | 10/1980 | Japan | 357/42 |

OTHER PUBLICATIONS

Goeloe et al., *Conf. IEDM*, Wash. D.C., Dec. 7–9, 1981, "Vert. Single Gate . . . ," 24.6.
*IBM Tech. Disc. Bull.*, "Integrated CMOS Structure," K. E. Kroell, vol. 15, No. 9, Feb. 1973, pp. 2856–2857.
Shinchi et al., "The Buried Oxide MOSFET . . . ," *IEEE Trans. on Electron Devices*, Oct. 1976, pp. 1190–1191.
K. Izumi et al., "C.M.O.S. Devices Fabricated on Buried $SiO_2$ Layers Formed by Oxygen Implantation Into Silicon," *Electronics Letters*, vol. 14, No. 18, 8/31/78.
J. Tihanyi et al. "Properties of ESFI MOS Transistors Due to the Floating Substrate and the Finite Volume", *IEEE Transactions on Electron Devices*, vol. ED-22, No. 11, Nov. 1975, pp. 1017–1023.

Primary Examiner—Martin H. Edlow
Assistant Examiner—Jerome Jackson, Jr.
Attorney, Agent, or Firm—Finnegan, Henderson, Farabow, Garret & Dunner

[57] ABSTRACT

An MOS type semiconductor device having a semiconductor substrate, an insulating layer formed in or on said semiconductor substrate, and an MOS transistor formed on said insulating layer, characterized in that said insulating layer is formed at a region below said MOS transistor excluding at least part of the region below a channel region of said MOS transistor.

1 Claim, 14 Drawing Figures

STACKED MOS DEVICE WITH MEANS TO PREVENT SUBSTRATE FLOATING

This application is a continuation-in-part of Ser. No. 271,116, filed June 8, 1981.

The present invention relates to an MOS type semiconductor device and, more particularly, to an MOS type semiconductor device having a buried insulating layer inside a semiconductor substrate.

It has been conventionally known to form a buried insulating layer inside a semiconductor substrate in a conventional MOS integrated circuit so as to insulate an active MOS transistor region from the semiconductor substrate, thereby reducing the parasitic capacitance. An MOS type semiconductor device using such technology is shown in "C.M.O.S. Devices Fabricated on Buried SiO$_2$ Layers Formed by Oxygen Implantation into Silicon", Electronics Letters 14, No. 18, p. 593 (1978). FIG. 1 shows the basic construction of such an MOS device.

Referring to FIG. 1, a buried insulating layer 2 is formed by ion-implanting oxygen or nitrogen in a semiconductor substrate 1 and annealing it thereafter. Referring to this figure, the part of the semiconductor substrate 1 below the buried insulating layer is denoted by 1a, and the part of the semiconductor substrate 1 on the buried insulating layer 2 is denoted by 1b. On a predetermined region of the semiconductor substrate 1b on the buried insulating layer 2 is formed a gate oxide film 3. A gate electrode 4 is formed thereon. A source region 5 and a drain region 6 are further formed in the semiconductor substrate 1b to provide an MOS transistor.

With an MOS transistor of such a construction, the transistor substrate is of floating structure as in the case of a transistor of SOS construction, resulting in some problems. For example, two kinks are included in the $V_D$-$I_D$ characteristic curve of such an MOS transistor as shown in FIG. 2. This phenomenon is the same as that shown in "Properties of ESFI MOS Transistors Due to the Floating Substrate and the Finite Volume" IEEE ED-22, No. 11 (1975) p. 1017. When the drain voltage $V_D$ becomes high and a relatively high electric field is generated in the vicinity of the drain junction, impact ionization is caused in the drain space charge layer. Then, holes are supplied from the vicinity of the drain region 6 to the semiconductor substrate 1b which is under the floating condition and is located below the channel region. The threshold voltage is then lowered, causing the first kink A$_1$. When the drain voltage V$_D$ becomes still higher, the potential difference between the substrate 1b and the source region 5 exceeds the built-in voltage of the source junction. Then, a parasitic bipolar transistor is turned on which has the source 5 as an emitter, the drain 6 as a collector, and the substrate 1b as a base. As a result, the second kink A$_2$ appears as shown in the curve in FIG. 2. An MOS transistor having the V$_D$-I$_D$ characteristic curve including these two kinks A$_1$ and A$_2$ is not desirable in various respects. Furthermore, when such a transistor performs high speed switching operations, the charge pumping phenomonon becomes predominant. Consequently, electrons are injected from the channel region to the substrate 1b to bias the substrate 1b in the reverse direction. This inconveniently raises the threshold voltage and increases the propagation delay time.

Technology is also known for CMOS (complementary MOS) for preventing the formation of a parasitic thyristor by insulating an MOS transistor region from a substrate 11 with buried insulating layers 12a and 12b, as shown in FIG. 3. However, this technology suffers from the same problems as the former technology. The parasitic thyristor operation of the CMOS transistor will be explained referring to FIG. 4. A parasitic thyristor is formed in a CMOS inverter shown in FIG. 4 when $\beta_{npn} \cdot \beta_{pnp}$ is greater than 1, where $\beta_{npn} \cdot \beta_{pnp}$ is the product of $\beta_{npn}$ of an npn bipolar transistor consisting of an n$^+$-type region 13, a p-type well region 14, and an n-type substrate 11 and $\beta_{pnp}$ of a pnp bipolar transistor consisting of a p$^+$-type region 15, an n-type substrate 11, and a p-type well region 14. The smaller the elements, the greater the product $\beta_{npn} \cdot \beta_{pnp}$ and the easier the formation of the parasitic thyristor. Thus, by combining n-channel MOS and p-channel MOS shown in FIG. 1 so as to form the CMOS shown in FIG. 3, the formation of the bipolar transistor may be prevented. However, this involves the problems described above.

It is, therefore, the primary object of the present invention to provide an MOS type semiconductor device wherein the parasitic capacitance is reduced and parasitic thyristor operation is prevented without placing the substrate potential of the MOS transistor under the floating condition.

In order to achieve the above and other objects, the present invention provides an MOS type semiconductor device having a semiconductor substrate, an insulating layer formed in or on said semiconductor substrate, and an MOS transistor formed on said insulating layer, which is characterized in that said insulating layer is formed at a region below said MOS transistor excluding at least part of the region below a channel region of said MOS transistor.

This invention can be more fully understood from the following detailed description when taken in conjunction with the accompanying drawings, in which.

An MOS type semiconductor device of the present invention will now be described in more detail.

In an MOS type semiconductor device of the present invention, an insulating layer is formed below an MOS transistor region. However, at least at part of the region below the channel region, the insulating layer is not formed. For this reason, a transistor substrate on the insulating layer is connected to a bulk substrate, and the potential of the transistor substrate does not achieve the floating condition.

The region at which the insulating layer is not formed need not be only part of the region below the channel region, but may be all of the region below the channel region. Furthermore, it need not be limited to the region below the channel region, but may extend to part of the region below the source region and/or drain region. That is to say, the insulating layer need only be formed within the range for allowing the reduction in the parasitic capacitance and the prevention of parasitic thyristor operation.

The insulating layer may be formed inside the semiconductor substrate by forming a mask such as a resist film at the part where the insulating layer is not to be formed, that is, at which a gate region is to be formed at the surface of the semiconductor substrate; ion-implanting oxygen or nitrogen in the semiconductor substrate; and annealing thereafter. Or, in the case of a three-dimensional device having two MOS transistors with the insulating layer interposed therebetween wherein the substrate of the upper MOS transistor and the substrate of the lower MOS transistor are connected through an opening formed in the insulating layer, the insulating layer may be formed by the CVD method or the like.

Various embodiments of the MOS type semiconductor device of the present invention will now be described.

Figure 1:
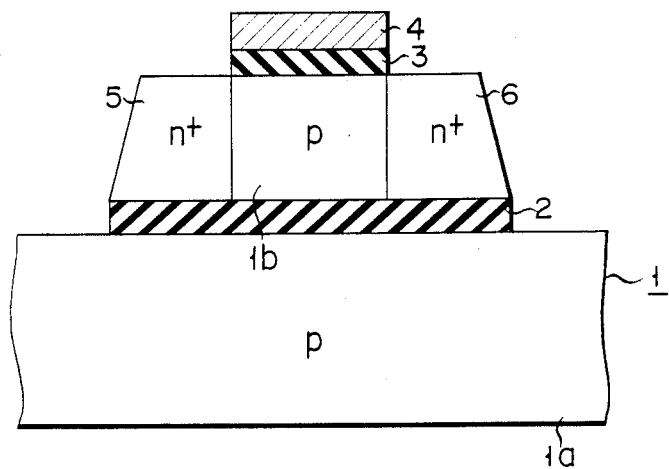
FIG. 1 is a sectional view of a conventional MOS transistor.
Figure 2:
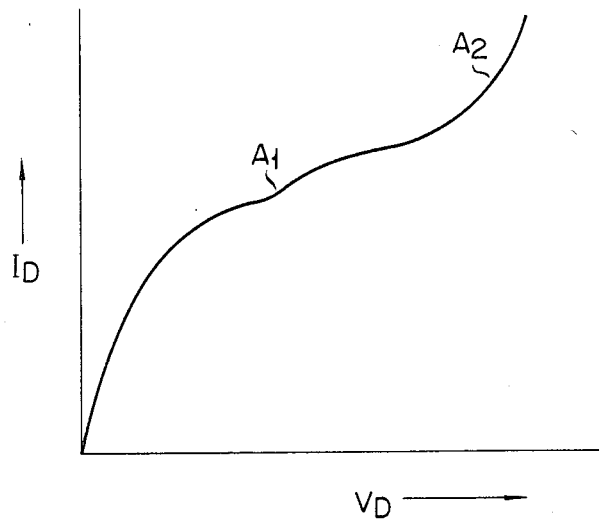
FIG. 2 shows the V$_D$-I$_D$ characteristics of the MOS transistor of FIG. 1.
Figure 3:
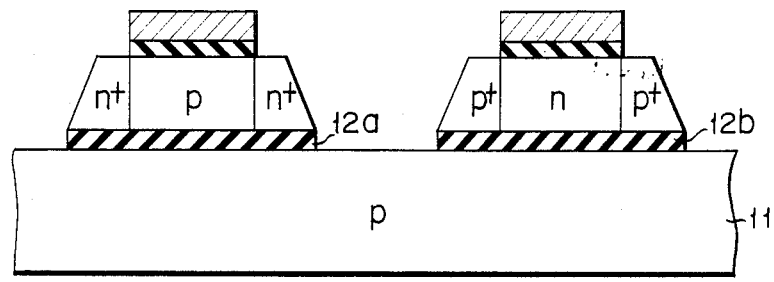
FIGS. 3 and 4 are sectional views of a conventional CMOS transistor.
Figure 4:
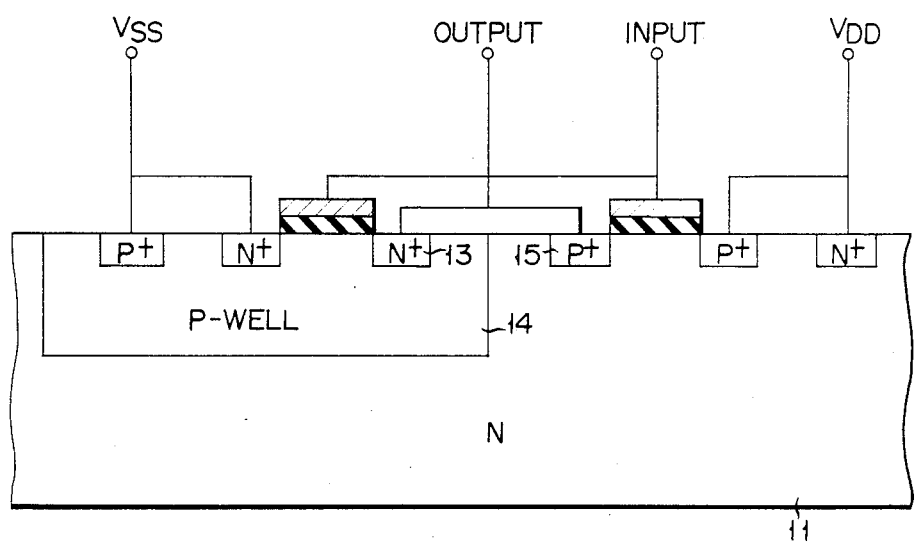
Figure 5:
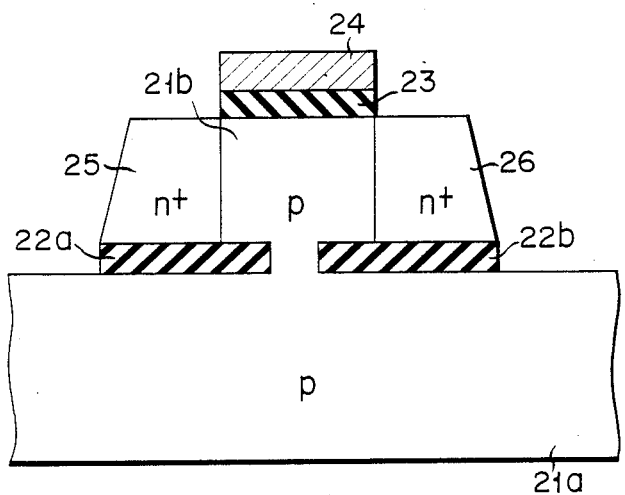
FIG. 5 is a sectional view of an MOS transistor according to an embodiment of the present invention.

In an MOS device as shown in FIG. 5, buried insulating layers 22a and 22b are formed in a p-type semiconductor substrate 21a. A gate oxide film 23 is formed on a predetermined region 21b of the semiconductor substrate on the buried insulating layers 22a and 22b, and a gate electrode 24 is formed thereover. A source region 25 and a drain region 26 are formed in the semiconductor substrate 21b to constitute an MOS transistor.

In an MOS transistor of this construction, the insulating layer is formed in the substrate at a region excluding part of the region below the channel region. That is, the insulating layer is not formed at part of the region below the channel region. Therefore, since the substrate 21b of the transistor region is not completely insulated from a bulk substrate 21a, a substrate bias may be applied to the substrate 21b for setting the substrate potential of the MOS transistor. As a result, an MOS transistor is provided which has excellent characteristics and which prevents the appearance of kinks in the $V_D$-$I_D$ characteristic curve and an increase in the propagation delay time due to charge pumping during high speed operation. In addition, in this MOS transistor, since the buried insulating layer is formed below the source region 25 and the drain region 26, the parasitic capacitance is reduced. It is to be noted that masking precision in the formation of the buried insulating layer need not be considered.

Figure 6A:
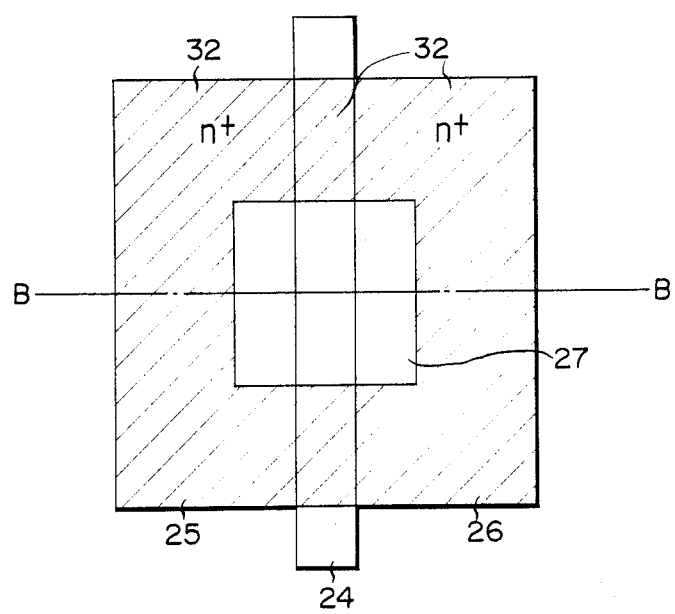
FIG. 6A is a plan view of an MOS transistor according to another embodiment of the present invention.
Figure 6B:
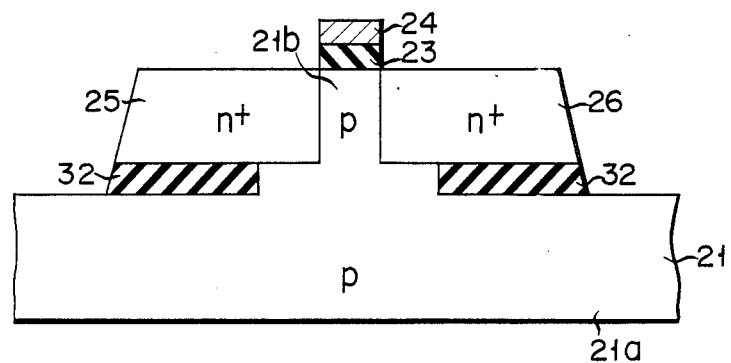
FIG. 6B is a sectional view along the line B—B of FIG. 6A.

In an MOS transistor as shown in FIGS. 6A and 6B, the part where the buried insulating layer is not formed extends to part of the region below the source region 25 and the drain region 26. Thus, as shown by the plan view of this MOS transistor in FIG. 6A, an opening 27 is formed at the center of a buried insulating layer 32, and this opening is extended not only to part of the region below the channel region, but also to part of the region below the source region 25 and the drain region 26. FIG. 6B is a sectional view along the line B—B of FIG. 6A.

When the channel length is small, on the order of submicrons as the elements become small, there may be cases where it is difficult to set the part where the buried insulating layer is not formed only at the region below the channel region. In such a case, the region where the buried insulating layer is not formed may be extended slightly outside the region below the channel region, as shown in FIGS. 6A and 6B, so that the reducing effect of the parasitic capacitance may not be impaired much.

Figure 7:
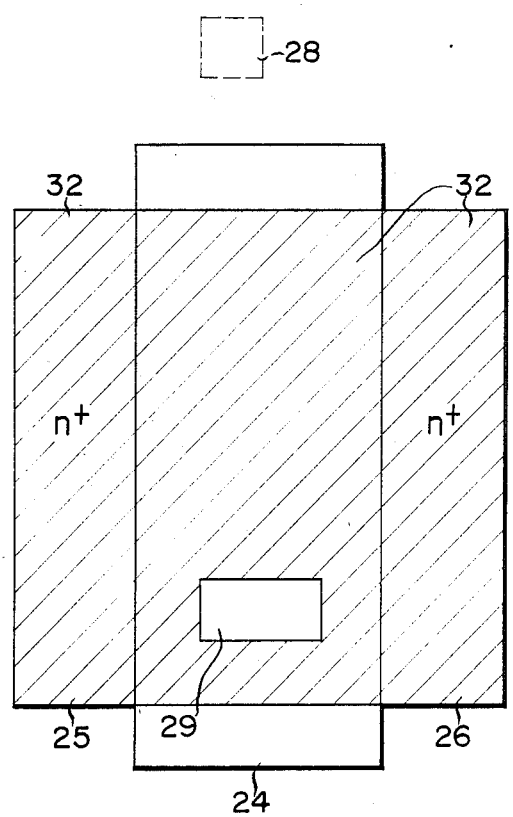
FIG. 7 is a plan view of an MOS device of the present invention on which is formed a memory cell.

In an MOS device according to the model plan view of FIG. 7, a memory cell 28 is formed in the vicinity of the MOS transistor. When an MOS transistor of great gate width participates in a pentode operation, the problem arises of erratic operation of the memory cell 28 formed on the substrate on which is also formed the transistor, since a substrate current of minority carriers may flow due to secondary impact ionization. Such erratic operation of the memory cell 28 may be prevented by connecting, at a position as far as possible from the memory cell 28, the bulk substrate 21a and the transistor substrate 21b, that is, by forming a region 29 at which the buried insulating layer is not formed. Of course, the increase in the parasitic capacitance which might be caused if the buried insulating layer is not formed and the damage to the element by the parasitic thyristor operation are prevented. The floating condition of the transistor substrate may also be prevented.

Figure 8A:
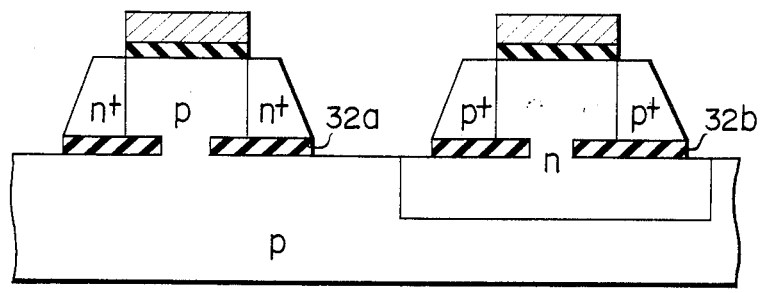
FIGS. 8A to 8D are sectional views of an MOS type semiconductor of the present invention as applied to a CMOS device.
Figure 8B:
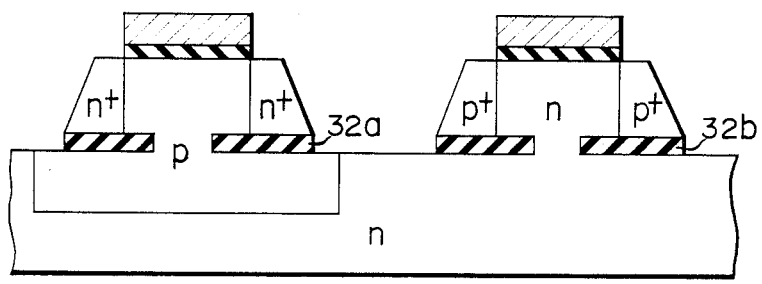
Figure 8C:
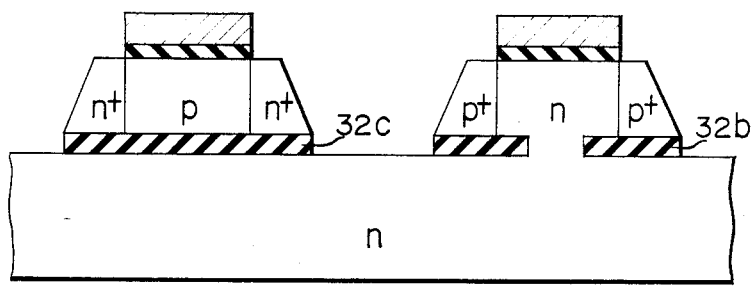
Figure 8D:
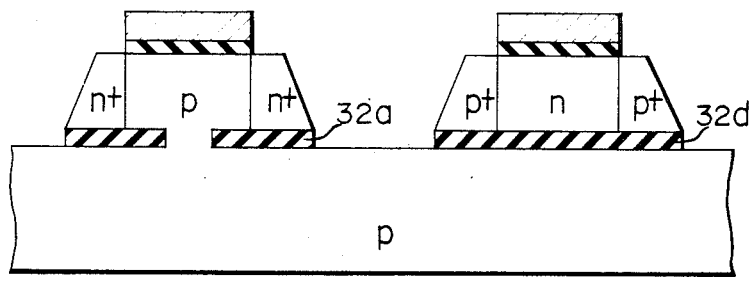

FIGS. 8A to 8D show an embodiment wherein the present invention is applied to a CMOS device. The buried insulating layers 32a and 32b are formed at both regions below a p-channel MOS and an n-channel MOS as shown in FIGS. 8A and 8B. However, similar effects may also be obtained by forming buried insulating layers 32a or 32b below only one of the MOSs while providing the buried insulating layer 32c or 32d over the entire region below the other MOS as shown in FIGS. 8C and 8D.

Figure 9A:
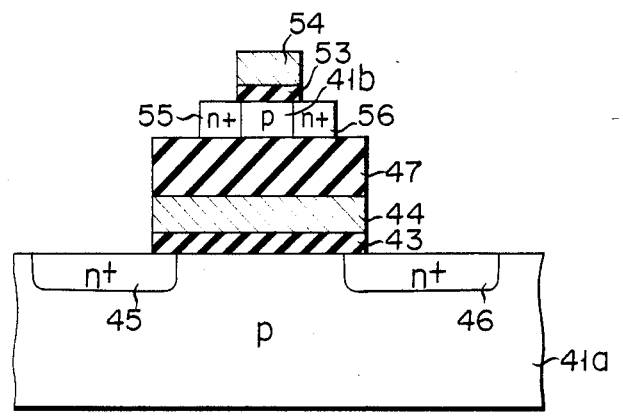
FIG. 9A is a sectional view of an MOS type semiconductor device of the present invention as applied to an MOS device of three-dimensional structure.
Figure 9B:
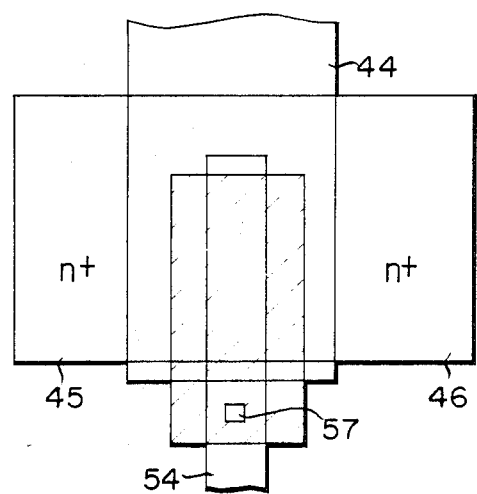
FIG. 9B is a plan view of FIG. 9A.

FIG. 9A is a sectional view of a three-dimensional IC of stacked construction wherein an n-channel transistor is formed on a semiconductor substrate 41a and a another n-channel transistor is formed thereover. FIG. 9B is a model plan view of FIG. 9A. A first layer n-channel transistor is formed wherein a first layer transistor gate electrode 44 is formed on a semiconductor substrate 41a through a first layer transistor gate oxide film 43, and a first layer transistor source region 45 and a first layer transistor drain region 46 are formed in the semiconductor substrate 41a. On this first layer n-channel transistor is formed a second layer transistor substrate 41b on an insulation layer 47 formed by, for example, the CVD method. As shown, a second layer transistor gate electrode 54 is formed on second layer transistor gate oxide film 53 which, in turn, is formed on substrate 41b. A second layer transistor source region 55 and a second layer transistor drain region 56 are formed in the substrate 41b to constitute the second layer n-channel transistor. An opening 57 is formed in the part of the insulating layer 47 below the channel region of the second layer transistor, as shown in FIG. 9B. Through this opening 57, the substrate 41b is electrically connected to the substrate 41a so that it is at the same potential as the substrate 41a. The integration of the device may be approximately doubled by stacking two transistors in this manner. Further, by forming the opening in the insulating layer between the two transistors to connect the substrates of both transistors, the floating effect with the substrate of the upper layer transistor may be eliminated.

What is claimed is:

1. An MOS type semiconductor device comprising:
   a. a semiconductor substrate of a first conducting type;

b. a first MOS transistor formed on a portion of said semiconductor substrate;
c. an insulating layer formed on said first MOS transistor and on a portion of said substrate, said insulating layer having an opening to said substrate; and
d. a second MOS transistor formed on said insulating layer at least in part over said first MOS transistor, said second MOS transistor comprising a source region of a second conductivity type completely separated from said substrate by said insulating layer, a drain region of said second conductivity type spaced from said source region and completely separated from said substrate by said insulating layer, and a channel region of said first conductivity type located between said source and drain regions and over said opening in said insulating layer and contacting said substrate through said opening.

* * * * *